US010387375B2

United States Patent
Groseclose et al.

(10) Patent No.: US 10,387,375 B2
(45) Date of Patent: *Aug. 20, 2019

(54) DATA COMPRESSION ALGORITHM SELECTION AND TIERING

(71) Applicant: INTERNATIONAL BUSINESS MACHINES CORPORATION, Armonk, NY (US)

(72) Inventors: Michael R. Groseclose, Tucson, AZ (US); Larry Juarez, Tucson, AZ (US); David Montgomery, Tucson, AZ (US); Jason L. Peipelman, Tucson, AZ (US); Joshua M. Rhoades, Tucson, AZ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 396 days.

This patent is subject to a terminal disclaimer.

(21) Appl. No.: 15/398,859

(22) Filed: Jan. 5, 2017

(65) Prior Publication Data

US 2017/0116233 A1 Apr. 27, 2017

Related U.S. Application Data

(63) Continuation of application No. 14/220,790, filed on Mar. 20, 2014, now Pat. No. 9,569,474, which is a (Continued)

(51) Int. Cl.
*G06F 16/21* (2019.01)
*G06F 16/174* (2019.01)
(Continued)

(52) U.S. Cl.
CPC .......... *G06F 16/1744* (2019.01); *G06F 3/067* (2013.01); *G06F 3/0608* (2013.01);
(Continued)

(58) Field of Classification Search
CPC ............ G06F 16/217; G06F 16/24561; G06F 3/0608; G06F 3/0638; G06F 3/067; H03M 7/30
See application file for complete search history.

(56) References Cited

U.S. PATENT DOCUMENTS

| 4,906,995 A | 3/1990 | Swanson |
| 5,951,623 A | 9/1999 | Reynar et al. |
| (Continued) | | |

FOREIGN PATENT DOCUMENTS

WO 9637846 A1 11/1996

OTHER PUBLICATIONS

IBM, Pattern matching in audio data to aid compression, Mar. 17, 2006, ip.com, IPCOM000134735D, pp. 2-5 (Year: 2006).*

(Continued)

*Primary Examiner* — James Trujillo
*Assistant Examiner* — Michal Lawrence Bogacki
(74) *Attorney, Agent, or Firm* — Griffiths & Seaton PLLC

(57) ABSTRACT

A data storage subsystem having a plurality of data compression engines configured to compress data, each having a different compression algorithm. A data handling system is configured to determine a present rate of access to data; select at least one sample of data; determine the greatest degree of compression of said data compression engines; determine the compression ratios of the operated data compression engines with respect to the selected sample(s); compressing said selected at least one sample with a plurality of said data compression engines at said selected tier; operate a selected data compression engines with respect to the selected sample and determine the greatest degree of compression of the data compression engines; compress the data from which the sample was selected with one of the operated data compression engines determined to have the (Continued)

greatest degree of compression; and store the compressed data in data storage repositories.

20 Claims, 5 Drawing Sheets

Related U.S. Application Data continuation of application No. 12/574,470, filed on Oct. 6, 2009, now Pat. No. 8,688,654.

(51) Int. Cl.
G06F 16/2455 (2019.01)
G06F 3/06 (2006.01)
H03M 7/30 (2006.01)

(52) U.S. Cl.
CPC .......... G06F 3/0638 (2013.01); G06F 16/217 (2019.01); G06F 16/24561 (2019.01); H03M 7/30 (2013.01)

(56) References Cited

U.S. PATENT DOCUMENTS

| | | | |
|---|---|---|---|
| 7,224,293 B2 | 5/2007 | Parker | |
| 7,225,211 B1* | 5/2007 | Colgrove | G06F 16/185 707/693 |
| 7,539,695 B2 | 5/2009 | Nishiyama | |
| 7,847,178 B2* | 12/2010 | Georges | G10H 1/0025 84/603 |
| 2002/0191692 A1* | 12/2002 | Fallon | H03M 7/30 375/240 |
| 2004/0114195 A1 | 6/2004 | Ebner et al. | |
| 2004/0230724 A1* | 11/2004 | Stager | G06F 3/0605 710/68 |
| 2005/0132161 A1* | 6/2005 | Makela | G06F 12/023 711/170 |
| 2005/0210054 A1 | 9/2005 | Harris | |
| 2006/0251331 A1 | 11/2006 | Zeineh | |
| 2007/0109156 A1* | 5/2007 | Fallon | G06T 9/00 341/50 |
| 2007/0150690 A1 | 6/2007 | Chen et al. | |
| 2008/0128388 A1 | 6/2008 | Balasubramaniam et al. | |
| 2008/0162523 A1 | 7/2008 | Kraus et al. | |
| 2008/0232457 A1 | 9/2008 | Fallon et al. | |
| 2008/0307191 A1 | 12/2008 | Lane et al. | |
| 2009/0046937 A1 | 2/2009 | Fenney et al. | |
| 2010/0107254 A1* | 4/2010 | Eiland | H04L 63/1416 726/23 |

OTHER PUBLICATIONS

IPCOM000134735D, "Pattern Matching in Audio Data to Aid Compression," Technical Disclosure, Mar. 17, 2006 (4 pages).

\* cited by examiner

DATA COMPRESSION ALGORITHM SELECTION AND TIERING

CROSS-REFERENCE TO RELATED APPLICATIONS

This application is a Continuation of U.S. patent application Ser. No. 14/220,790, filed on Mar. 20, 2014, which is a Continuation of U.S. patent application Ser. No. 12/574,470, filed on Oct. 6, 2009 that is now U.S. Pat. No. 8,688,654, and commonly assigned U.S. patent application Ser. No. 12/128,388, filed May 28, 2008, now U.S. Patent Application Publication 2008/0307191, is incorporated for its showing of a data storage system having data compression.

FIELD OF THE INVENTION

This invention relates to the field of data processing and data storage systems, and more particularly to data compression within such systems.

BACKGROUND OF THE INVENTION

Data processing systems employ and generate extensive amounts of data, much of which is stored by data storage systems. A way of reducing the physical amount of storage is to compress at least some of the data. Many data compression engines employing various data compression algorithms exist to accomplish the data compression, some providing greater degrees of compression of some types of data, others greater degrees of compression of other types of data, and some with all types of data. Some data compression engines can recompress data that has already been compressed. A prevalent means of measuring the degree of data compression is the compression ratio, meaning the ratio of the amount of original data to the amount of compressed data, such as 10:1. Another aspect of data compression is the latency of the compression of data and of the uncompression or decompression of compressed data. Typically, the greater the compression ratio, the more complex the data compression, and the greater the latency. Of course, the shortest latency is to data that is uncompressed.

As the result, the user manually selects the data compression engines based on expected needs, and the amount of data storage expected to be available, which is often cost driven. Also, the data compression engines may vary widely in cost, effecting the decision. The user may then establish a policy regarding what data and how much data is to be compressed versus what data and how much data is left uncompressed, as discussed in the incorporated '388 application. The policies may remain fixed and may or may not result in data storage space efficiency or in rapid access over time.

SUMMARY OF THE INVENTION

Methods, data storage subsystems, and computer program products are provided for data storage and data compression.

In one embodiment, a data storage subsystem comprises data storage; a plurality of data compression engines configured to compress data, each having a different compression algorithm; at least one input configured to receive data to be compressed and stored by the data storage; and at least one data handling system configured to perform steps comprising:

selecting at least one sample of data to be compressed and stored;

operating a plurality of the data compression engines to compress the selected sample(s);

determining the compression ratios of the operated data compression engines with respect to the selected sample(s);

operating the data compression engine determined to have the greatest compression ratio with respect to the selected sample(s), to compress the data; and storing the compressed data.

In a further embodiment, the step of selecting the sample(s) comprises selecting a plurality of samples randomly from the data.

In another embodiment, the step of selecting the sample(s) comprises selecting a plurality of samples in accordance with a hashing algorithm.

In still another embodiment, the data storage subsystem comprises data storage; a plurality of data compression engines configured to compress data, each having a different compression algorithm, the compression engines arranged in a plurality of tiers from low to high in accordance with expected latency to compress data and to uncompress compressed data; at least one input configured to receive data to be compressed and stored by the data storage; and at least one data handling system configured to perform steps comprising:

determining a present rate of access to data;

if the rate of access indicates the data is to be compressed, selecting a tier of data compression engine with respect to the data that is inverse to the present rate of access;

selecting at least one sample of the data;

operating a plurality of the data compression engines at the selected tier to compress the selected sample(s);

determining the greatest degree of compression of the operated data compression engines with respect to the selected sample(s); and operating the data compression engine determined to have the greatest degree of compression with respect to the selected sample(s), to compress the data.

In a further embodiment, the present rate of access to the data comprises the inactivity time from the most recent access to at least a portion of the data, the less inactivity time, the greater the rate of access.

In another embodiment, the present rate of access to the data comprises the number of accesses to at least a portion of the data within a time window, the greater the number of accesses, the greater the rate of access.

In a further embodiment, the data handling system is additionally configured to perform the step of storing the compressed data in a repository of the data storage, the repository associated with the data compression engine employed to compress the data.

In a still further embodiment, at least two of the repositories are classified into parent and child categories, each at a different tier, the parent repository associated with a data compression engine having a lesser degree of compression than the child, and the data handling system is additionally configured to perform the step of moving data between the parent and the child category repositories in accordance with the inverse of the present rate of access.

In another embodiment, the data handling system is configured to perform the step of compressing the data for the parent category repository, and recompressing the data for the child category repository.

In still another embodiment, the data handling system is configured to perform the step of compressing the data for the parent category repository, and uncompressing and again compressing the data for the child category repository.

In another embodiment, the data handling system is configured to perform the steps of determining whether none of the compression engines exceeds a minimum degree of compression, and, if so, disallowing compression of the data.

For a fuller understanding of the present invention, reference should be made to the following detailed description taken in conjunction with the accompanying drawings.

DETAILED DESCRIPTION OF THE INVENTION

This invention is described in preferred embodiments in the following description with reference to the Figures, in which like numbers represent the same or similar elements. While this invention is described in terms of the best mode for achieving this invention's objectives, it will be appreciated by those skilled in the art that variations may be accomplished in view of these teachings without deviating from the spirit or scope of the invention.

Figure 1:
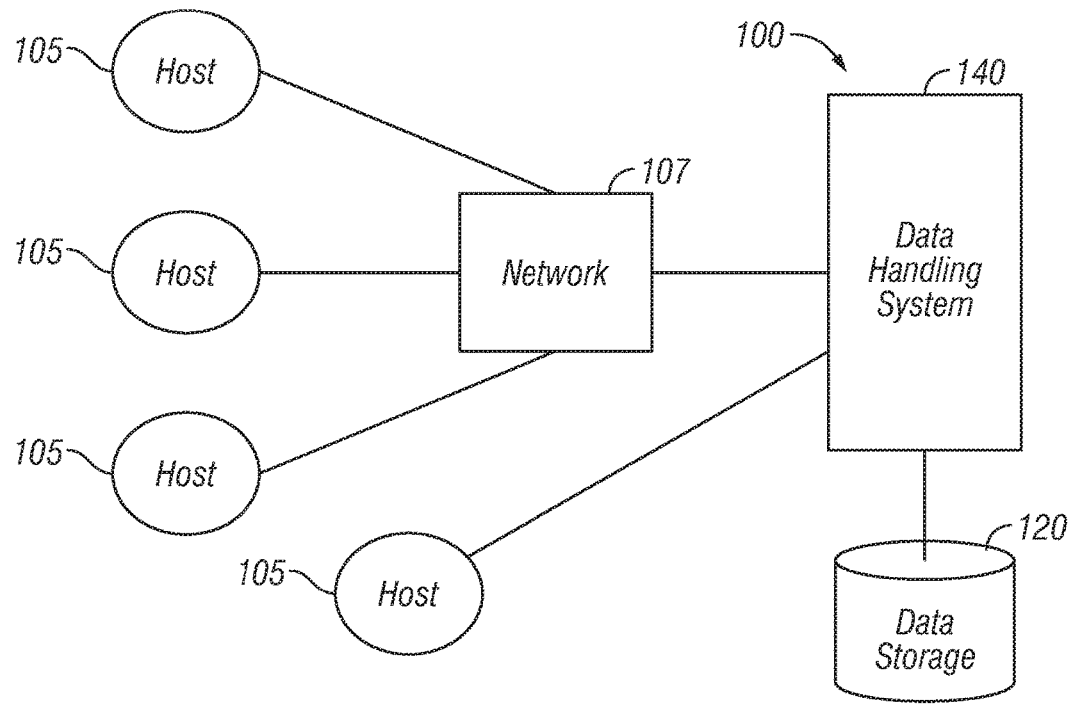
FIG. 1 is a diagrammatic illustration of hosts and of a data storage system which may implement the present invention.

Referring to FIG. 1, an example of a data storage system 100 is illustrated which stores data for hosts 105 and selectively compresses and uncompresses the data. The hosts 105 may be directly connected to the data storage system 100, or may be connected by means of a network 107, such as through Network Attached Storage (NAS). The data is stored in data storage 120 and is handled by a data handling system 140. Generally speaking, a way of reducing the physical amount of storage is to compress at least some of the data. Many data compression engines employing various data compression algorithms exist to accomplish the data compression, some providing greater degrees of compression of some types of data, others greater degrees of compression of other types of data, and some are more complex but provide significantly greater compression. Some data compression engines can recompress data that has already been compressed. A prevalent means of measuring the degree of data compression is the compression ratio, meaning the ratio of the amount of original data to the amount of compressed data, such as 10:1. Not all data compresses well by all compression algorithms. Some data may be compressed well by one algorithm and not by another, and it may be possible that the amount of data may be larger after the compression than before. As discussed in the incorporated '388 application, compression policies may govern the compression of the data. Another aspect of data compression is the latency of the compression of data and of the uncompression of compressed data. Typically, the greater the compression ratio, the more complex the data compression, and the greater the latency. The shortest latency is to data that is uncompressed. A typical procedure is to store data in an uncompressed state in higher speed data storage so long as it is accessed often, and then the data is compressed when it is no longer accessed.

Figure 2:
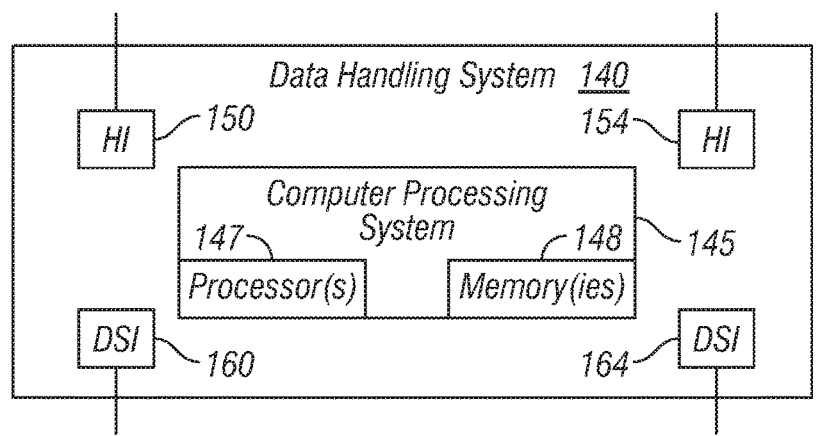
FIG. 2 is a block diagram of an exemplary data handling system for operating the data storage system of FIG. 1.

Referring to FIG. 2, the data storage system 100 of FIG. 1 comprises a data handling system 140 to control the handling and storage of the data and of associated metadata. The data handling system comprises a computer processor system 145 configured to operate the data storage system, the computer processor system having computer processor(s) 147 configured to operate the data storage system, and memory(ies) 148 configured to store information and computer readable program information for operating the computer processor(s). Herein "computer processor", "computer processing system", "control", "controller" or "data handling system" may comprise any suitable logic, programmable logic, microprocessor, and associated or internal memory for responding to program instructions, and the associated or internal memory may comprise fixed or rewritable memory or data storage devices. The program information may be supplied to the subsystem control or memory from a host or via a data storage drive or disk array, or by an input from a floppy or optical disk, or by being read from a cartridge, or by a web user interface or other network connection, or by any other suitable means. The program information thus may comprise one or more program products comprising a computer useable storage medium having computer usable program code stored therein for operating the data storage system 100, or similar types of systems or devices.

Host interfaces 150, 154 may comprise one or more host adapters, Fibre Channel ports, one or more PICON ports, one or more ESCON ports, one or more SCSI ports, or other suitable ports. Each host interface is configured to communicate with a host system 105 or network 107 of FIG. 1 such that the data handling system can handle I/O from any host or using entity. In one example, the interfaces 150, 154 connect to an Ethernet based network 107 via standard TCP/IP protocols and allow the user to effectively send data directly to magnetic tape in a virtual environment.

Data storage interfaces 160, 164 may comprise communication links for communication with data storage 120. The communication links may comprise device adapters, for example for serial interconnections, such as RS-232 or RS-422, Ethernet connections, SCSI interconnections, ESCON interconnections, PICON interconnections, a Local Area Network (LAN), a private Wide Area Network (WAN), a public wide area network, Storage Area Network (SAN), Transmission Control Protocol/Internet Protocol (TCP/IP), the Internet, and combinations thereof.

An example of a data handling subsystem 140 comprises an IBM® Enterprise Storage Server, IBM® Model DS 8000, or other comparable system.

The data may be arranged in various units of data of constant or variable sizes. In one example, data is arranged in units of data called "files". In other examples, data is arranged in units of data called "data sets", or "extents" or "sectors". Another example is related to addressing and is called "LUN" s for Logical Units. Other examples are known to those of skill in the art. Hence, herein, the generic terms used are "data" or "extent".

Figure 3:
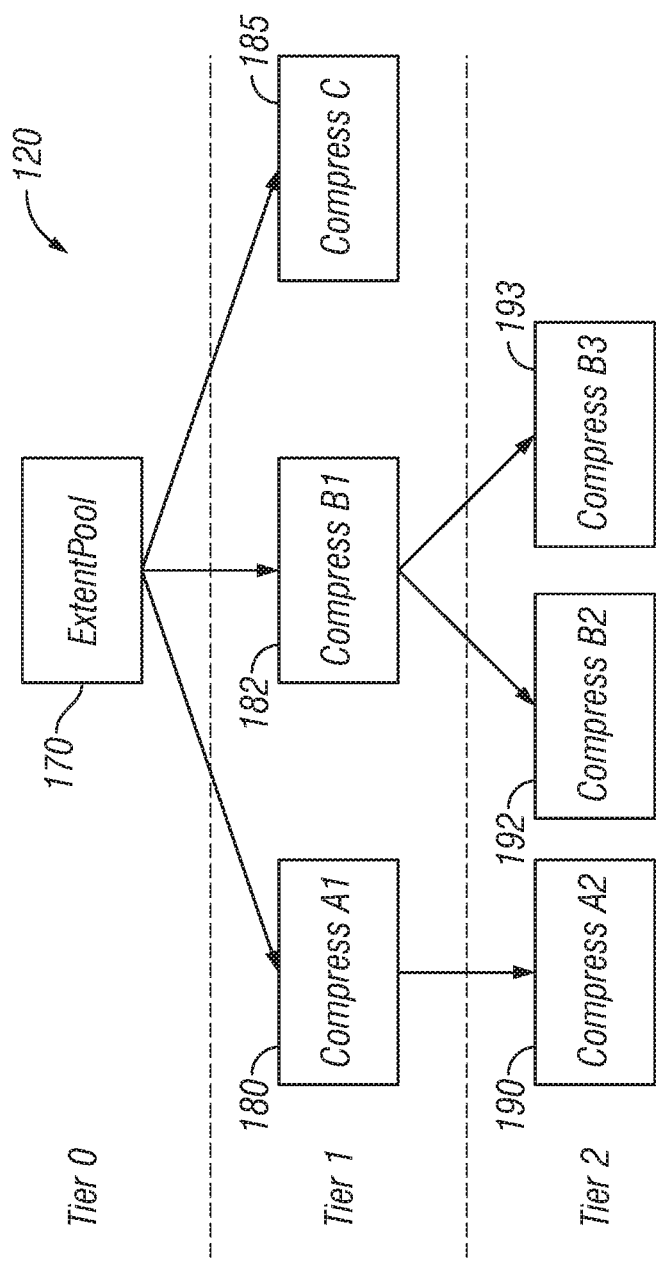
FIG. 3 is a data flow diagram illustrating exemplary data flow in the data storage system of FIG. 1.

FIG. 3 represents data flow of data storage 120 involving various compression engines employing various compression algorithms, and may also represent repositories for data that has been compressed according to the various algorithms. The data storage 120 is arranged according to various tiers of data compression. The tiers comprise a plurality of data compression engines arranged in tiers from low to high in accordance with expected latency to compress data and to uncompress compressed data. Tier 0 represents the lowest tier of data compression, and may comprise uncompressed data or data that has been compressed by the host, and is in the form of an extent pool 170. Tier 1 represents data compression engines 180, 182, 185 that compress data according to algorithms that have relatively low latencies. The reference numerals 180, 182, 185 also represent the repositories in storage 120 for data compressed by the respective compression engines. Tier 2 represents data compression engines 190, 192, 193 that compress data according to algorithms that have the greatest degree of compression. The reference numerals 190, 192, 193 also represent the repositories in storage 120 for data compressed by the respective compression engines. The compression engines may comprise compression algorithms present in memory(ies) 148 which operate the processor(s) 147 to compress and uncompress the data. Alternatively, the compression engines may be implemented in the data storage 120.

Alternatively, for data that has been sampled and the samples compressed according to various algorithms, the compression engines are arranged in tiers given what the sampling returned. So, for a given data, the latency to compress the data, based on compressing the samples, may differ from the latency to compress other data to a degree that the tiering is different from that of the other data.

Referring to FIGS. 1, 2 and 3, when data is to be compressed, the data handling system 140 selects at least one sample of the data that is to be compressed, for example samples of a data extent that is uncompressed from extent pool 170, and which data is to be compressed and stored in compressed form. The selection of samples may comprise selecting a plurality of samples randomly from the data that is to be compressed. Alternatively, the selection of samples may comprise selecting a plurality of samples in accordance with a hashing algorithm.

As an example, the data extent is to be compressed by one of the Tier 1 compression engines 180, 182, 185. The data handling system operates a plurality of the data compression engines 180, 182, 185 to compress the selected sample(s). In one example, the data handling system determines the compression ratios of the data compression engines 180, 182, 185 with respect to the selected sample(s), and determines the data compression engine having the greatest compression ratio. The data handling system then operates the data compression engine determined to have the greatest compression ratio with respect to the selected sample(s), to compress the data extent. The compressed data may be stored in the repository associated with the data compression engine.

The same process may be employed to further compress data or to compress data with data compression engines 190, 192, 193 that compress data according to algorithms that have the greatest degree of compression. In one example, it may be desirable to further compress data that has been compressed and is stored at one of the Tier 1 repositories 180, 182, 185. The further compression may occur in one of two ways, taking the existing compressed data and further compressing it, or uncompressing the existing compressed data and compressing it anew. Alternatively, certain compression engines may employ algorithms that are compatible, such that they have a parent and child relationship in that the parent compression engine 182 has low access latency, and one or more children compression engines 192, 193 have the greatest degree of compression.

Algorithms may be complementary and arranged in tiers as parent and child, in one example, because using them together up front would cause the compression and uncompression latency to be unacceptable. Thus, data is initially compressed by a parent compression engine and, when the rate of access indicates further compression is desirable, it is compressed further using the complementary child compression engine.

In one example, it may be desirable to further compress a compressed data extent of Tier 1 stored in repository 182 with a child compression engine 192 or 193. In one example, a child compression engine is direct in that the already compressed data may be compressed by the child compression engine without being uncompressed first. In another example, the child compression engine could compress the data only after it has been uncompressed. The data handling system 140 selects at least one sample of the data extent that is to be further compressed from repository 182. As an example, the data handling system operates the data compression engines 192, 193 to compress the selected sample(s). In one example, the data handling system determines the compression ratios of the data compression engines 192, 193 with respect to the selected sample(s), and determines the data compression engine having the greatest compression ratio. The data handling system then operates the data compression engine determined to have the greatest compression ratio with respect to the selected sample(s), to further compress the data extent. The compressed data may be stored in the repository associated with the data compression engine.

Compressing the selected samples may result in a determination that none of the compression engines exceeds a minimum degree of compression. For example, all of the compression engines may result in expanding the selected samples rather than actually compressing them, or the compression ratios may be unacceptably small. Thus, there is no point in compressing or further compressing the data, and compression of the data is disallowed, leaving the data uncompressed, or compressed to the level of the previous tier.

In another example, the data of the extent may have been compressed by the host system, and the host requires or advises that the data not be further compressed. Still alternatively, the host may require that certain data be left uncompressed.

Figure 4:
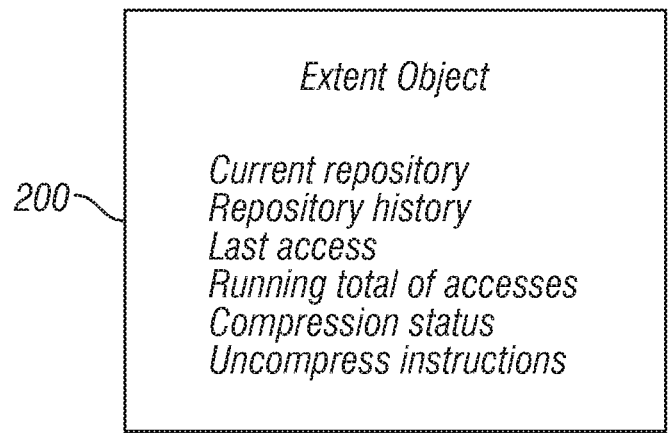
FIG. 4 is a diagrammatic illustration of information of an extent object of the data storage system of FIG. 1.
Figure 5:
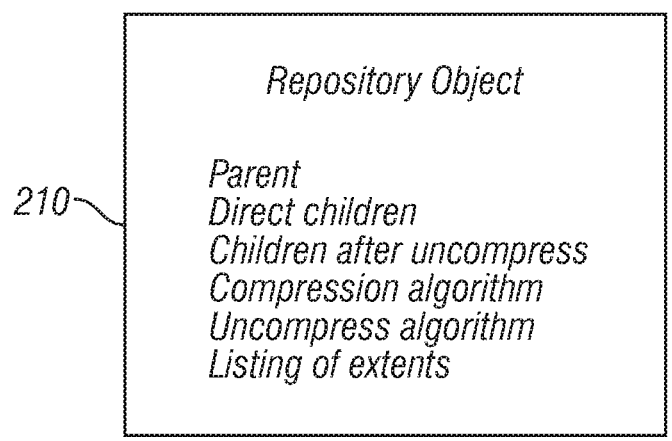
FIG. 5 is a diagrammatic illustration of information of a repository object of the data storage system of FIG. 1.

FIGS. 4 and 5 illustrate information regarding the data stored by the repositories in data storage 120. The information may, for example, be maintained by the data handling system.

FIG. 4 illustrates extent object information 200 of an extent, for example, an extent stored in one of the repositories. Examples of the extent information comprise the repository currently holding the extent (which also indicates the compression engine accomplishing the compression, if any), the history of the various repositories having held the extent (which may be truncated if the history length exceeds a threshold), the last access of the extent (which may be the date and/or time at which the access occurred, indicated for example by a clock of the data handling system), a running total of the number of accesses of the extent (for example, within a predetermined time window), the compression status (indicating whether the extent can or should be able to be compressed further, for example, data that is already compressed by a host may be designated as not further compressible), and the sequence of instructions to execute to uncompress or uncompress the data of the extent.

FIG. 5 illustrates the information 210 of a repository object. Examples of the repository information comprise whether the repository and compression engine are a parent having at least one child repository and compression engine, a list of possible direct children compression engines for extents in this repository (discussed above as direct in that the already compressed data may be compressed by the child compression engine without uncompressing first), a list of possible children compression engines for extents in this repository that could compress the data only after it has been uncompressed, the algorithm used to compress data that is put in this repository, and the algorithm used to uncompress data in this repository. The repository object may also comprise a listing of all the extents currently in the repository.

Figure 6A:
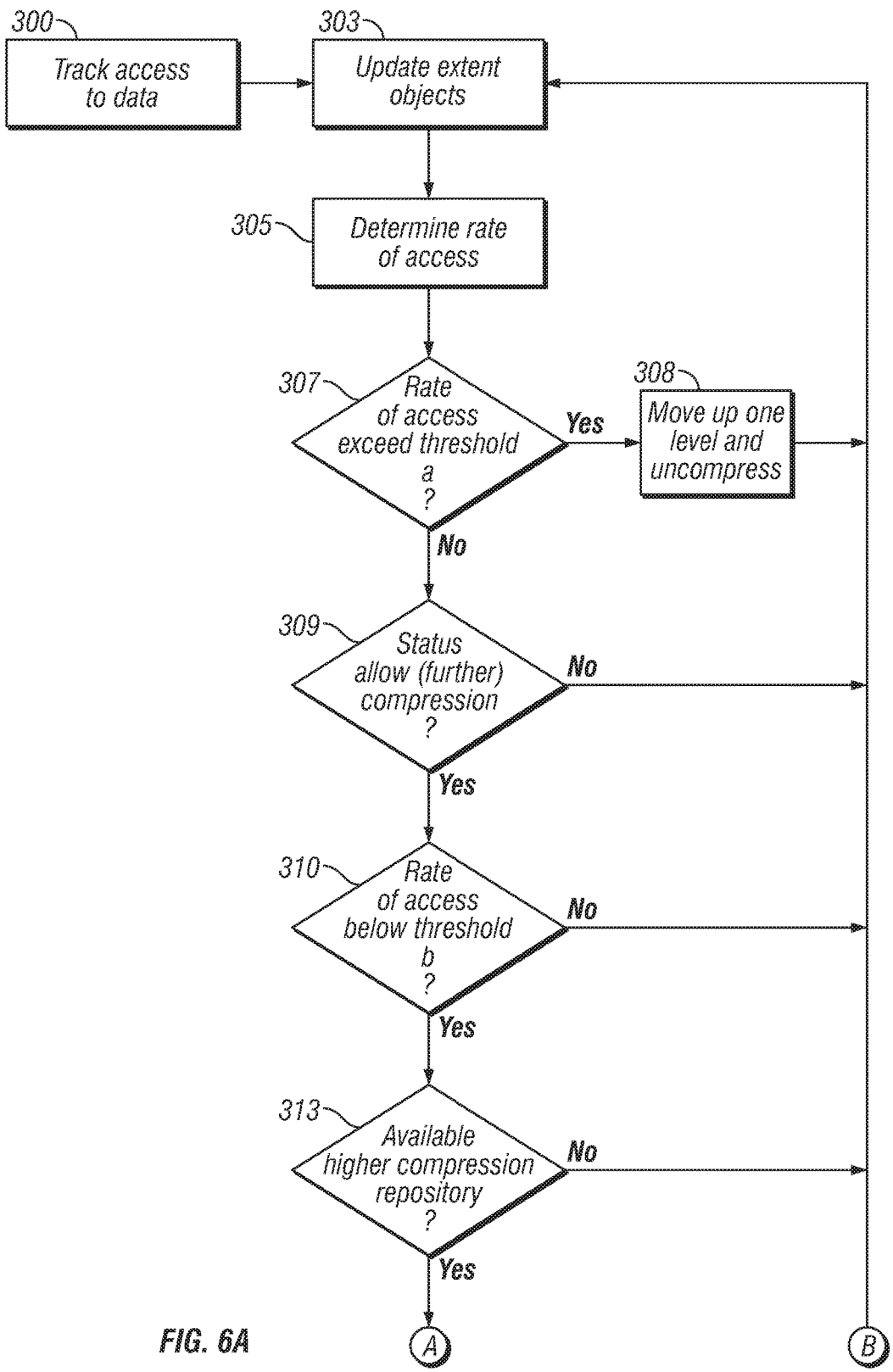
FIGS. 6A and 6B represent a flow chart depicting an exemplary method of operating the data storage system of FIG. 1.
Figure 6B:
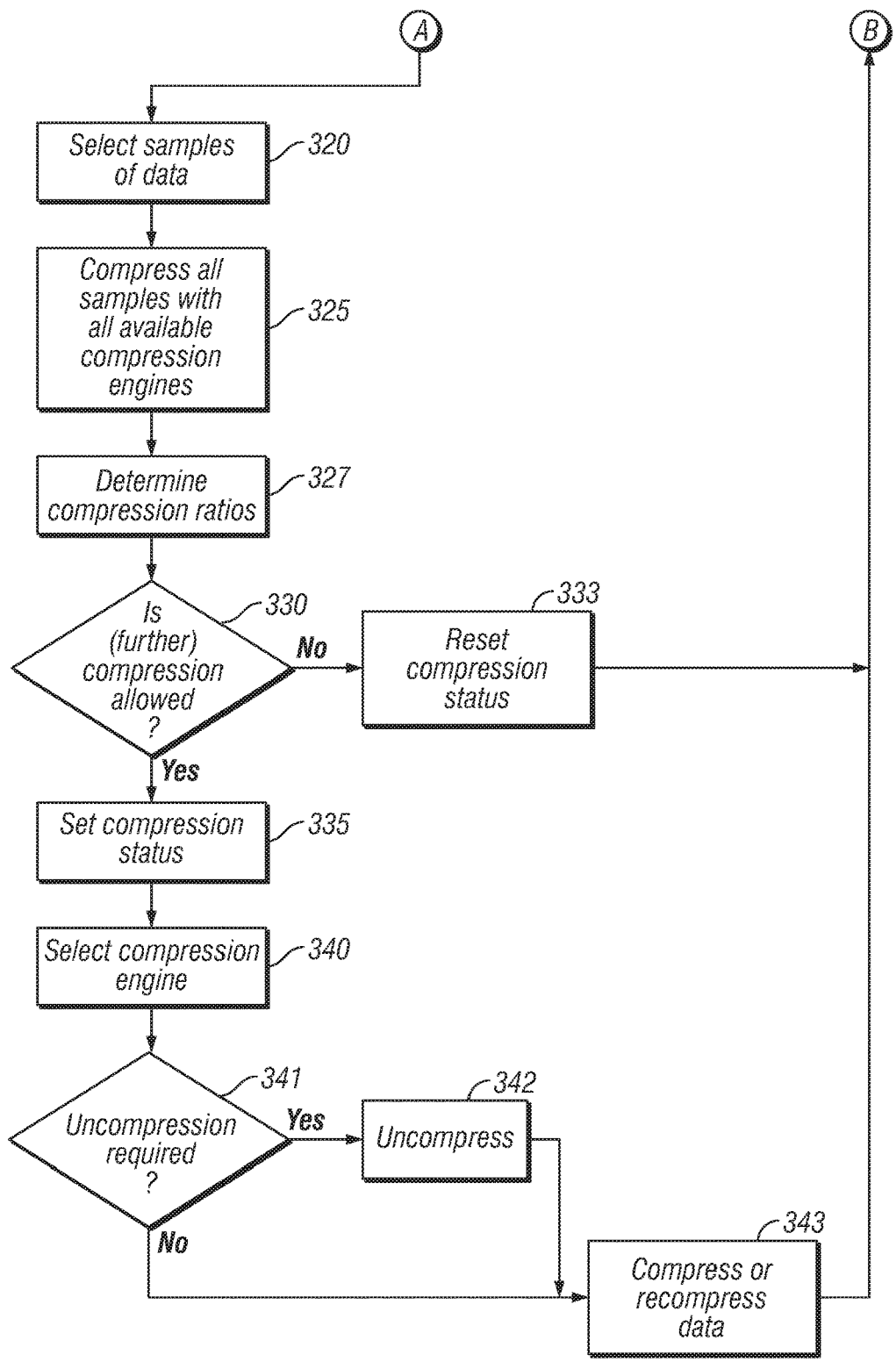

FIGS. 6A and 6B represent an example of a process to determine the present rate of access to data; select a tier of data compression engine with respect to the data that is inverse to the present rate of access; if the rate of access indicates the data is to be compressed, select at least one sample of data; compress the selected sample(s); determine the compression ratios of the operated data compression engines with respect to the selected sample(s); and select the data compression engine having the greatest compression ratio with respect to the selected sample(s), to compress the data.

Referring to FIGS. 1, 3, 4, 5, 6A and 6B, in step 300, in one embodiment, the data handling system 140 or data storage system 120, or both, track the access to data. The access is usually a command to read data, but may also comprise updating the data. The access to data stored in a repository where it is compressed typically requires that the data be uncompressed or decompressed and provided in accordance with the command. If the data is read and not updated, there is no change to the data in the repository. If the data is updated, it may be treated as new data and provided to the extent pool 170 or compressed and provided to the same or a new repository. The old data that preceded the update may be retained or discarded.

Either periodically or at each access to data, in step 303, the extent object 200 for each accessed data is updated. In one example, the last access (e.g. time of access) is updated, and/or the running total of accesses (e.g. within a window) is updated.

In step 305, the rate of access for the data that has been accessed is determined from the information of the updated extent objects. The present rate of access may be determined from the inactivity time from the most recent access to at least a portion of the data, the less inactivity time, the greater the rate of access. The inactivity time is based on the difference between the last access time from the extent object 200 and the present time. Alternatively, the present rate of access to the data comprises the number of accesses tracked in the extent object 200 to at least a portion of the data within a time window, the greater the number of accesses, the greater the rate of access.

As discussed above, the data storage 120 comprises a plurality of data compression engines, each having a different compression algorithm, and arranged in a plurality of tiers from low to high in accordance with expected latency to compress data and to uncompress compressed data.

In step 307, a determination is made whether the rate of access for a particular extent of data meets or exceeds a first threshold "a", which is a threshold indicating that the rate of access is high enough to warrant moving the data to a tier having lower compression latency. If the threshold is met or exceeded, in step 308, the uncompress instructions are obtained from the extent object 200 and the uncompress algorithm is obtained from the repository object 210, and the data is uncompressed and sent to a lower latency tier and compressed again, if needed, to a repository at the lower latency tier. In one example, a data extent of repository 185 is found to meet or exceed the rate of access threshold "a", and is uncompressed, for example by the associated compression engine, and provided to the extent pool 170. Alternatively, since the data may have been uncompressed at the last access, that uncompressed data may already be stored in the extent pool 170, and the metadata will be updated to reflect the change. The space of the data in the repository 185 is made available for storing additional data, for example, as free space. In step 303, the move to the new repository is noted in the extent object 200, and the list of extents is changed accordingly in the repository objects for repository 170 and repository 185.

In step 309, the compression status of the extent object 200 for the extent of data is checked to determine whether the data is compressible, or further compressible. For example, none of the compression engines may exceed a minimum degree of compression with respect to the extent of data, as discussed above. The compression status may thus indicate that the extent of data is to be left uncompressed, or not further compressed.

Alternatively, the host may require that the data of the extent not be compressed, either because it has been compressed sufficiently by the host, or because the host requires that it be left uncompressed.

In one example, the compression status may be designated as "is Compressible", and set to "False" if it is not compressible, or not further compressible.

If the compression status indicates the data is not compressible, or not further compressible, step 309 returns to step 303 disallowing compression or further compression of the data.

If the rate of access does not meet or exceed threshold "a", in step 310, a determination is made whether the rate of access for a particular extent of data meets or is below a second threshold "b", which is a threshold indicating that the rate of access is low enough to warrant moving the data to a higher latency, greater degree of compression, tier. Thus, if the rate of access indicates the data is to be compressed, a tier of data compression engine is selected with respect to the data that is inverse to the present rate of access. For example, the rate of access may be derived from the low number of or no accesses of the data within a prescribed time window, or the rate of access may comprise a time since the last access occurred.

If the rate of access is within the boundaries of the thresholds of steps 307 and 310, the data remains in the present repository and the process returns to step 303 for updating other extent objects as needed.

If the rate of access for a data extent meets or is below the threshold "b" of step 310, step 313 determines whether a higher compression repository is available. For example, the data extent may presently reside in Tier 1 repository 185 of data storage 120 be earmarked by a host as limiting its compressibility as indicated by the compression status of the extent object 200. Alternatively, the repository object 210 may indicate that there is no direct child compression engine and repository and no child compression engine and repository that is available even after uncompression. In either case, the data remains in the present repository and the process returns to step 303 for updating other extent objects as needed.

If step 313 indicates that at least one higher compression engine and repository is available, the process discussed above to select the compression engine and repository is employed, beginning at step 320. In step 320, the data handling system 140 selects at least one sample of the data that is to be compressed, for example samples of a data extent that was compressed by one of the Tier 1 compression engines 182 and is to be further compressed. As discussed above, the samples may be selected randomly from the data to be compressed, or may be selected from the data to be compressed in accordance with a hashing algorithm.

In the example, the repository object information 210 for repository 182 may indicate that it is a parent repository and that two direct child repositories are repositories 192 and 193. The data handling system operates the data compression engines 192, 193, in step 325 to compress the selected sample(s). In one example, in step 327, the data handling system determines the compression ratios of the data compression engines 192 and 193 with respect to the selected sample(s), and determines the data compression engine having the greatest compression ratio. Step 330 determines if any of the data compression engines has provided a usable compression of the data sample(s). If not, for example, the compression ratio is less than a predetermined amount or is negative, negative compression resulting in more data after the compression, step 333 resets the compression status for the extent in the extent object 200 to indicate that the data of the extent is not compressible, or not further compressible, and returns to step 303.

If at least one of the data compression engines, for example, engines 192 and 193, does comprise an acceptable compression for the selected samples, step 335 sets the compression status in the extent object 200 to indicate that the extent can or should be able to be compressed further.

Step 340 comprises selecting the desired data compression engine, for example choosing between engines 192 and 193. In one example, the choice is the data compression engine having the greatest compression ratio with respect to the selected sample(s).

Step 341 determines whether the data of the extent is uncompressed, or, if compressed, may be compressed by the selected compression engine without being uncompressed, or whether the data of the extent must be uncompressed before being compressed again by the selected compression engine. For example, complementary parent and child compression engines may allow recompression of compressed data, whereas non-complementary compression engines may require uncompression, for example, as identified in the repository object 210.

If uncompression is required, the data of the extent is uncompressed in step 342.

The data handling system 140, in step 343, then operates the data compression engine determined to have the greatest compression ratio with respect to the selected sample(s), to compress the data extent in accordance with the compression algorithm of repository object 210. The compressed data may be stored in the repository associated with the data compression engine.

In the example of repositories and data compression engines 182, 192 and 193, the repositories are classified into parent and child categories, each at a different tier, the parent repository 182 associated with a data compression engine having a lesser degree of compression than the children 192 and 193, and the data handling system 140 moves data between the parent and the child category repositories in accordance with the inverse of the present rate of access. Thus, the data for the parent category repository 182 is compressed data, and is further compressed or recompressed for the selected child category 192, 193. Repositories 192 and 193 may comprise direct children of repository 182, in which the already compressed data may be recompressed.

In another example, repository 190 may comprise a child to parent repository 180 in which the compression engine could compress the data only after it has been uncompressed. Thus, step 343 comprises uncompressing the data compressed in repository 180 in accordance with the uncompress instructions of the extent object 200 for the extent and the algorithm of the repository object 210 for the data compression engine 180. Then, step 343 comprises compressing the uncompressed data in accordance with the compression algorithm of the repository object for the data compression engine 190.

Upon completion of the compression or recompression of the data in step 343, the process returns to step 303 to update both the extent object 200 with the current repository and the repository history, and the repository objects for the repositories respectively losing and gaining the data extent.

Referring to FIG. 2, the implementations may involve software, firmware, micro-code, hardware and/or any combination thereof. The implementation may take the form of code or logic implemented in a medium, such as memory(ies) 148, storage 120 and/or circuitry 147 where the medium may comprise hardware logic (e.g. an integrated circuit chip, Programmable Gate Array [PGA], Application Specific Integrated Circuit [ASIC], or other circuit, logic or device), or a computer readable storage medium, such as a magnetic storage medium (e.g. an electronic, magnetic, optical, electromagnetic, infrared, or semiconductor system, semiconductor or solid state memory, magnetic tape, a removable computer diskette, and random access memory [RAM], a read-only memory [ROM], a rigid magnetic disk and an optical disk, compact disk-read only memory [CD-ROM], compact disk-read/write [CD-R/W] and DVD).

Those of skill in the art will understand that changes may be made with respect to the methods discussed above, including changes to the ordering of the steps. Further, those of skill in the art will understand that differing specific component arrangements may be employed than those illustrated herein.

While the preferred embodiments of the present invention have been illustrated in detail, it should be apparent that modifications and adaptations to those embodiments may occur to one skilled in the art without departing from the scope of the present invention as set forth in the following claims.

What is claimed is:

1. A method for selectively compressing data for a data storage system having a plurality of data compression engines, each having a different compression algorithm, comprising the steps of:
    determining a present rate of access to data;
    selecting at least one sample of said data;
    determining a greatest degree of compression of a plurality of data compression engines with respect to said selected at least one sample;
    compressing said selected at least one sample with a plurality of said data compression engines at a selected tier;
    operating said selected data compression engines with respect to said selected at least one sample and determining the greatest degree of compression of said data compression engines from said operation of said data compression engines with respect to said selected at least one sample;

compressing said data from which said at least one sample was selected with the one of said operated data compression engines determines to have said greatest degree of compression with respect to said selected at least one sample; and storing said compressed data in data storage repositories associated with the data compression engine employed to compress said data;

wherein said step of compressing said data comprises compressing said data for a parent category repository, and recompressing said data for a child category repository.

2. The method of claim 1, further including performing at least one of:

if said rate of access indicates said data is to be compressed, selecting a tier of data compression engines with respect to said data that is inverse to said present rate of access;

randomly selecting at least one sample of said data to be compressed and stored;

determining compression ratios of said data engines from said operation of said data compression engines with respect to said selected at least one sample;

arranging said plurality of data compression engines in a plurality of tiers from low to high in accordance with expected latency to compress data and to uncompress compressed data; and moving data between said parent and said child category, wherein at least two of said repositories are classified into parent and child categories, each at a different said tier, said parent having a lesser degree of compression than said child, and said computer program product computer readable program code, when executed on a computer processing system, causes said computer processing system to additionally move data between said parent and said child category repositories in accordance with the inverse of said present rate of access.

3. The method of claim 1, wherein said present rate of access to said data comprises the inactivity time from the most recent access to at least a portion of said data, the less inactivity time, the greater the rate of access.

4. The method of claim 1, wherein said present rate of access to said data comprises the number of accesses to at least a portion of said data within a time window, the greater the number of accesses, the greater the rate of access.

5. The method of claim 1, further including the step of:
compressing said data with the one of said data compression engines determined to have said greatest degree of compression with respect to said selected at least one sample, and determining the compression ratios of said operated data compression engines with respect to said selected at least one sample.

6. The method of claim 1, wherein said step of compressing said data comprises compressing said data for said parent category repository, and uncompressing and again compressing said data for said child category repository.

7. The method of claim 1, additionally comprising the steps of determining whether none of said plurality of compression engines exceeds a minimum degree of compression; and, if so, disallowing compression of said data.

8. A data storage subsystem, comprising:
data storage;
a plurality of data compression engines configured to compress data, each having a different compression algorithm, said compression engines arranged in a plurality of tiers from low to high in accordance with expected latency to compress data and to uncompress compressed data;
at least one input configured to receive data to be compressed and stored by said data storage; and
at least one data handling system configured to perform steps comprising:
determining a present rate of access to data;
selecting at least one sample of said data;
determining a greatest degree of compression of said data compression engines with respect to said selected at least one sample;
compressing said selected at least one sample with a plurality of said data compression engines at a selected tier;
operating said selected data compression engines with respect to said selected at least one sample and determining the greatest degree of compression of said data compression engines from said operation of said data compression engines with respect to said selected at least one sample;
compressing said data from which said at least one sample was selected with the one of said operated data compression engines determines to have said greatest degree of compression with respect to said selected at least one sample; and
storing said compressed data in data storage repositories associated with the data compression engine employed to compress said data;
wherein said step of compressing said data comprises compressing said data for a parent category repository, and recompressing said data for a child category repository.

9. The data storage subsystem of claim 8, wherein said data handling system is configured to:
if said rate of access indicates said data is to be compressed, selecting a tier of data compression engines with respect to said data that is inverse to said present rate of access;
randomly select at least one sample of said data to be compressed and stored;
determine compression ratios of said data engines from said operation of said data compression engines with respect to said selected at least one sample,
arrange said plurality of data compression engines in a plurality of tiers from low to high in accordance with expected latency to compress data and to uncompress compressed data, and
move data between said parent and said child category, wherein at least two of said repositories are classified into parent and child categories, each at a different said tier, said parent having a lesser degree of compression than said child, and said computer program product computer readable program code, when executed on a computer processing system, causes said computer processing system to additionally move data between said parent and said child category repositories in accordance with the inverse of said present rate of access.

10. The data storage subsystem of claim 8, wherein said present rate of access to said data comprises the inactivity time from the most recent access to at least a portion of said data, the less inactivity time, the greater the rate of access.

11. The data storage subsystem of claim 8, wherein said present rate of access to said data comprises the number of accesses to at least a portion of said data within a time window, the greater the number of accesses, the greater the rate of access.

12. The data storage subsystem of claim 8, wherein said data handling system is additionally configured to perform the step of:
compressing said data with the one of said data compression engines determined to have said greatest degree of compression with respect to said selected at least one sample, and
determining the compression ratios of said operated data compression engines with respect to said selected at least one sample.

13. The data storage subsystem of claim 8, wherein said data handling system is configured to perform said step of compressing said data, comprising compressing said data for said parent category repository, and uncompressing and again compressing said data for said child category repository.

14. The data storage subsystem of claim 8, wherein said data handling system is additionally configured to determine whether none of said plurality of compression engines exceeds a minimum degree of compression; and, if so, to disallow compression of said data.

15. A computer program product for storing data, said computer program product comprising a non-transitory computer readable storage medium having computer readable program code, wherein said computer readable program code, when executed on a computer processing system, causes said computer processing system to:
determine a present rate of access to data;
select at least one sample of said data;
determine a greatest degree of compression of a plurality of data compression engines with respect to said selected at least one sample;
compress said selected at least one sample with a plurality of said data compression engines at a selected tier;
operate said selected data compression engines with respect to said selected at least one sample and determining the greatest degree of compression of said data compression engines from said operation of said data compression engines with respect to said selected at least one sample;
compress said data from which said at least one sample was selected with the one of said operated data compression engines determines to have said greatest degree of compression with respect to said selected at least one sample; and
store said compressed data in data storage repositories associated with the data compression engine employed to compress said data;
wherein said step of compressing said data comprises compressing said data for a parent category repository, and recompressing said data for a child category repository.

16. The computer program product of claim 15, further including a computer program product computer readable program code that causes said computer processing system to including perform at least one of:
if said rate of access indicates said data is to be compressed, selecting a tier of data compression engines with respect to said data that is inverse to said present rate of access;
randomly selecting at least one sample of said data to be compressed and stored;
determining compression ratios of said data engines from said operation of said data compression engines with respect to said selected at least one sample;
arranging said plurality of data compression engines in a plurality of tiers from low to high in accordance with expected latency to compress data and to uncompress compressed data; and
moving data between said parent and said child category wherein at least two of said repositories are classified into parent and child categories, each at a different said tier, said parent having a lesser degree of compression than said child, and said computer program product computer readable program code, when executed on a computer processing system, causes said computer processing system to additionally move data between said parent and said child category repositories in accordance with the inverse of said present rate of access.

17. The computer program product of claim 15, wherein said present rate of access to said data comprises the inactivity time from the most recent access to at least a portion of said data, the less inactivity time, the greater the rate of access.

18. The computer program product of claim 15, wherein said present rate of access to said data comprises the number of accesses to at least a portion of said data within a time window, the greater the number of accesses, the greater the rate of access.

19. The computer program product of claim 15, wherein said step of compressing said data comprises compressing said data for said parent category repository, and uncompressing and again compressing said data for said child category repository.

20. The computer program product of claim 15, further including a computer program product computer readable program code that causes said computer processing system to determine whether none of said plurality of compression engines exceeds a minimum degree of compression; and, if so, disallowing compression of said data.

* * * * *